United States Patent
Höpfner

(10) Patent No.: US 6,531,378 B2
(45) Date of Patent: Mar. 11, 2003

(54) METHOD FOR PROCESSING WAFER BY APPLYING LAYER TO PROTECT THE BACKSIDE DURING A TEMPERING STEP AND REMOVING CONTAMINATED PORTIONS OF THE LAYER

(75) Inventor: Joachim Höpfner, Planegg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/968,576

(22) Filed: Oct. 1, 2001

(65) Prior Publication Data

US 2002/0086532 A1 Jul. 4, 2002

Related U.S. Application Data

(63) Continuation of application No. PCT/DE00/00938, filed on Mar. 24, 2000.

(30) Foreign Application Priority Data

Apr. 1, 1999 (DE) .......................... 199 15 078

(51) Int. Cl.⁷ ............................................. H01L 21/324
(52) U.S. Cl. ...................................... 438/473; 438/476
(58) Field of Search ............................... 438/471, 473, 438/476

(56) References Cited

U.S. PATENT DOCUMENTS

| | | | |
|---|---|---|---|
| 3,494,809 A | 2/1970 | Ross | |
| 4,053,335 A | 10/1977 | Hu | |
| 4,561,171 A * | 12/1985 | Schlosser | 29/572 |
| 5,162,241 A * | 11/1992 | Mori et al. | 437/10 |
| 5,223,734 A | 6/1993 | Lowrey et al. | |
| 5,424,224 A | 6/1995 | Allen et al. | |
| 5,539,245 A * | 7/1996 | Imura et al. | 257/610 |
| 5,679,405 A | 10/1997 | Thomas et al. | |
| 5,716,875 A | 2/1998 | Jones, Jr. et al. | |
| 5,721,145 A * | 2/1998 | Kusakabe et al. | 437/12 |
| 5,895,236 A * | 4/1999 | Yaoita | 438/143 |
| 6,046,095 A * | 4/2000 | Horikawa | 438/471 |
| 6,136,708 A * | 10/2000 | Aoki | 438/687 |

FOREIGN PATENT DOCUMENTS

| | | |
|---|---|---|
| DE | 286 459 A5 | 1/1991 |
| EP | 0 549 995 A2 | 7/1993 |
| JP | 54069964 | 6/1979 |
| JP | 56-83948 A | 7/1981 |
| JP | 9-223698 A * | 8/1997 ......... H01L/21/322 |

OTHER PUBLICATIONS

"Continuous Gettering of Contaminants Using Multiple Polysilicon Films," IBM Technical Disclosure Bulletin, vol. 33, No. 11, pp. 400–401, Apr. 1991.*

Publication by W. Hönlein: "Neue Dielektrika für Gbit–Speicherchips" (New Dielectra for Gbit–Memory Chips), Phys. BL. 55, No. 2, 1999, published by Wiley –VCH Verlag GmbH, pp. 51–53(in German).

* cited by examiner

Primary Examiner—Olik Chaudhuri
Assistant Examiner—Stephen W. Smoot
(74) Attorney, Agent, or Firm—Laurence A. Greenberg; Werner H. Stemer; Gregory L. Mayback

(57) ABSTRACT

A method for processing a monocrystalline Si-semiconductor wafer includes a tempering step at a temperature of over 550° C. A protective layer for protecting against the penetration of metal and/or rare earth metal substances into the Si-semiconductor wafer during the tempering step is applied to the back of the Si-semiconductor wafer before the tempering step.

14 Claims, 1 Drawing Sheet

METHOD FOR PROCESSING WAFER BY APPLYING LAYER TO PROTECT THE BACKSIDE DURING A TEMPERING STEP AND REMOVING CONTAMINATED PORTIONS OF THE LAYER

CROSS-REFERENCE TO RELATED APPLICATION

This application is a continuation of copending International Application No. PCT/DE00/00938, filed Mar. 24, 2000, which designated the United States.

BACKGROUND OF THE INVENTION

Field of the Invention

The invention relates to a method for processing a monocrystalline Si-semiconductor wafer. The monocrystalline Si-semiconductor wafer has a front side which is at least partially processed with respect to a sequence of layer deposition processes.

Conventional microelectronic memory elements (DRAMs) mostly use oxide or nitride layers which have a dielectric constant of a maximum of about 8 as a storage dielectric. In order to make a storage capacitor smaller and to produce nonvolatile memories (FRAMs), "new type" capacitor materials (dielectrics or ferroelectrics) having distinctly high dielectric constants are needed. For that purpose, capacitor materials $Pb(Zr,Ti)O_3$ [PZT], $SrBi_2Ta_2O_9$ [SBT], $SrTiO_3$ [ST] and $(Ba,Sr)TiO_3$ [BST] are known from pages 51–53 of a generic publication entitled "Neue Dielektrika für Gbit-Speicherchips" [New Dielectrics for Gbit memory chips] by W. Hönlein, Phys. Bl. 55 (1999).

The use of those new type dielectrics/ferroelectrics with high epsilon presents problems for various reasons. For one thing, those new type materials can no longer be combined with the traditional electrode material (poly)silicon. For that reason, inert electrode materials such as, for example, Pt or conductive oxides (e.g. $RuO_2$) must be used. Furthermore, a diffusion barrier (e.g. of TiN, TaN, Ir, $IrO_2$ and $MoSi_2$) must be inserted between the electrode material and the conductive connecting structure (plug) to the transistor.

Finally, the production of such structures requires a position of the new type high-epsilon dielectrics/ferroelectrics in an oxygen atmosphere and the usually multiple tempering of the already partially processed Si-semiconductor wafer at temperatures above 550° C.

In practice, having to use those new type substances (metal and rare earth metals) for the high-epsilon dielectric/ferroelectric, the electrodes and the barrier layer, in connection with the requirements of having to use high process temperatures which favor diffusion processes, results in a considerably increased risk of contamination of the Si-semiconductor wafer during production.

U.S. Pat. No. 5,679,405 describes a method in which an Ar gas flow is conducted over the back of a semiconductor wafer which is mounted on a substrate holder in a CVD reactor in order to reduce adsorption of contamination.

U.S. Pat. No. 5,424,224 describes a method in which the back of a semiconductor wafer is protected by application of a protective $SiO_2$ or $Si_3N_4$ layer during polishing of the front and of the edge of the wafer. The protective layer is removed again after the polishing process.

Patent Abstracts of Japan Publication No. 56-83948 describes a method for processing a semiconductor substrate in which a layer containing contamination and being formed of a semiconductor material or its oxide is applied to the back of the semiconductor substrate. The contamination is distributed in the semiconductor substrate in a later tempering step.

U.S. Pat. No. 4,053,335 describes a method for processing a monocrystalline Si-semiconductor wafer in which the semiconductor wafer is subjected to a temperature treatment step at a temperature of over 550° C. during the processing. Before the processing, a polycrystalline silicon layer is applied as a getter layer to the back of the Si-semiconductor wafer. A protective layer protecting against the penetration of contamination during the temperature treatment step, for example a silicon nitride layer, is applied to the polycrystalline silicon layer.

Similarly, in Patent Abstracts of Japan Publication No. 54-069964, silicon nitride layers are directly applied as protective layers to the front and back of a semiconductor substrate through the use of a plasma CVD process. The subsequent heat treatment step takes place at a temperature of about 500° C. and is used for reducing contact resistances of applied electrode layers.

U.S. Pat. No. 5,716,875 describes a method for producing CMOS transistors and ferroelectric capacitors on a semiconductor substrate in which silicon nitride layers are applied as protective layers to the side walls of the wafer and the back of the wafer substrate. As described therein, a LPCVD process can preferably be performed for the deposition.

In U.S. Pat. No. 5,223,734, a production method for semiconductor components is described in which the back of a semiconductor wafer is thinned and roughened by chemical/mechanical planarization (CMP). In that process, crystal dislocations are produced in the vicinity of the surface of the back of the wafer which are used as traps for moving contamination. That creates a getter layer through the use of which contamination in the semiconductor substrate can be trapped in a heat treatment step.

SUMMARY OF THE INVENTION

It is accordingly an object of the invention to provide a method for processing a Si-semiconductor wafer which overcomes the hereinafore-mentioned disadvantages of the heretofore-known methods of this general type, which enables risks of contamination of the semiconductor wafer to be reduced during a tempering step and in which the Si-semiconductor wafer is at least partially processed at the front and is protected against contamination in a subsequent tempering step.

With the foregoing and other objects in view there is provided, in accordance with the invention, a method for processing a monocrystalline Si-semiconductor wafer, which comprises subjecting the Si-semiconductor wafer to a plurality of tempering steps at a temperature of over 550° C. A protective layer is applied to the back of the Si-semiconductor wafer, at least once before a tempering step. The protective layer protects against penetration of at least one metal and/or rare earth metal substance into the Si-semiconductor wafer during the tempering step. The protective layer is at least partially removed for removing a contaminated surface area between two of the tempering steps. Applying the protection layer to the back of the Si-semiconductor wafer in accordance with the invention prevents metal and/or rare earth metal substances from being able to become adsorbed at the "naked" back of the semiconductor wafer before or during the tempering step, from being able to pass into the monocrystalline Si material by diffusion and from contaminating it during the tempering step. Such contamination of the semiconductor material is unwanted since it can lead to an impairment of the life and/or electrical characteristics of the components which are produced on the front of the semiconductor wafer.

In accordance with another mode of the invention, the protective layer is a $Si_3N_4$ barrier layer. It has been found that a nitride layer forms a decidedly efficient diffusion barrier, especially compared with Pt.

In accordance with a further mode of the invention, the $Si_3N_4$ barrier layer is preferably deposited through the use of an LPCVD (Low Pressure Chemical Vapor Deposition) process. This provides a very "dense" nitride with a low etching rate and good diffusion barrier characteristics.

In accordance with an added mode of the invention, a $SiO_2$ buffer layer is suitably applied to the Si-semiconductor wafer before the $Si_3N_4$ barrier layer is deposited. This prevents excessive tensions which can impair the homogeneity, the mechanical stability and the diffusion barrier effect of the $Si_3N_4$ barrier layer, from building up between the monocrystalline silicon substrate and the $Si_3N_4$ barrier layer.

In accordance with an additional mode of the invention, in a second preferred embodiment, the protective layer is a $SiO_2$ barrier layer. The $SiO_2$ barrier layer also counteracts contamination of the monocrystalline Si-semiconductor substrate, assuming that its effect is based on inclusion or enhancement processes of the substance or substances to be kept away in the layer to a greater extent than in the case of the $Si_3N_4$ barrier layer.

In accordance with yet another mode of the invention, in a third preferred embodiment, the protective layer is a barrier layer which is formed of a three-layer structure and is built up of a polysilicon sublayer embedded in two $SiO_2$ sublayers or a multilayer structure formed of alternatingly disposed $SiO_2$ and polysilicon sublayers.

In accordance with yet a further mode of the invention, the thickness of the protective layer can be selected as a function of the layer material being used, the type and dose rate of the substance or substances and the process conditions (particularly temperature and duration of the tempering step). The protective layer preferably has a thickness of greater than 30 nm, particularly greater than 100 nm.

In accordance with yet an added mode of the invention, the protective layer is doped with a substance acting as a trapping center for the substance or substances to be kept away from the Si-semiconductor substrate, particular phosphorous. The doping increases the inclusion or adsorption capability of the protective layer with respect to the substance or substances.

During the processing of the front of the Si-semiconductor wafer, a number of layer deposition steps are usually carried out during which various such substances (metals and/or rare earth metals) are released. In accordance with yet an additional mode of the invention, the protective layer is subjected, after a layer deposition process, to a scrubbing for removing deposited substances and/or for partially removing the protective layer to remove a more contaminated surface area after a layer deposition process or between two tempering steps. The result of this mode of the invention is that the degree of occupancy or enhancement of the protective layer with contaminating substances is reduced before the next tempering step.

In accordance with a concomitant mode of the invention, the back of the Si-semiconductor wafer is deliberately damaged in an area close to the surface before applying the protective layer. However, a "damage layer" formed in this manner is capable of adsorbing and "demobilizing" the substances mentioned and thus of counteracting their diffusion into the monocrystalline Si-semiconductor substrate, additionally to the protective layer.

Other features which are considered as characteristic for the invention are set forth in the appended claims.

Although the invention is illustrated and described herein as embodied in a method for processing a monocrystalline Si-semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a fragmentary, diagrammatic, cross-sectional view of a layer sequence of a DRAM memory cell constructed in a Si-semiconductor wafer with a switching transistor and a high-epsilon or ferroelectric stack capacitor.

DESCRIPTION OF THE PREFERRED EMBODIMENTS

Figure 1:
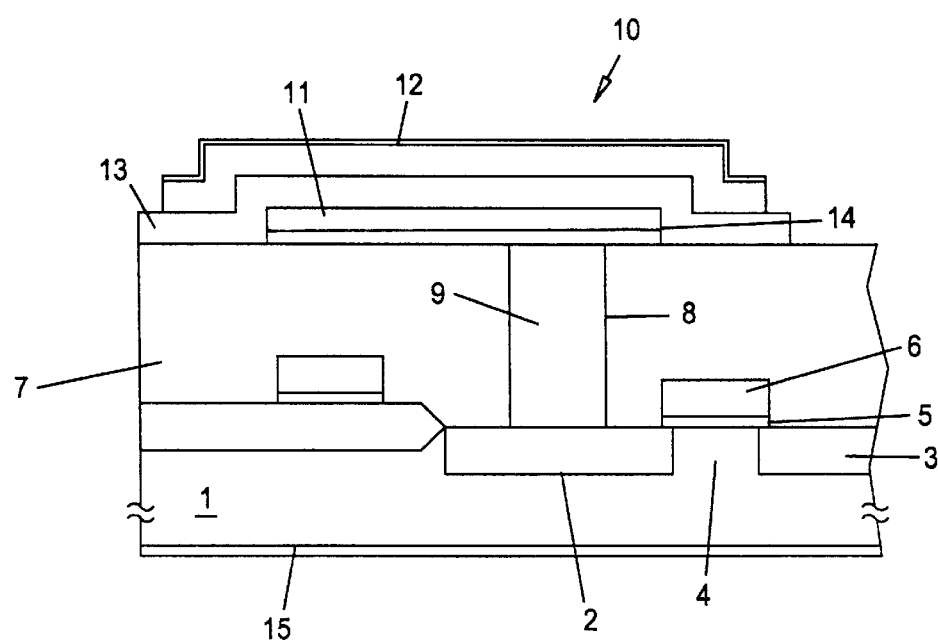

Referring now in detail to the single figure of the drawing, there is seen an N-channel MOS transistor built up through the use of conventional planar methods (layer deposition, layer patterning by using lithographic and etching techniques, layer doping) on a p-doped Si-semiconductor substrate 1.

An n+-doped drain region 2 is separated from an n+-doped source region 3 by an intermediate channel 4 of substrate material. A thin gate oxide layer 5 is located above the channel 4. A polysilicon gate electrode 6 is applied to the gate oxide layer 5.

A cover oxide layer 7, which has a contact hole 8 formed therein, is deposited above the MOS transistor 2, 3, 4, 5, 6 described above. The contact hole 8 is filled with an electrical connecting structure 9 (plug) formed of polysilicon.

The construction and method of production of the illustrated structure are known. A bipolar transistor, or any other monolithic semiconductor function element, can also be provided instead of the MOS transistor 2, 3, 4, 5, 6 shown herein.

A capacitor 10 is provided above the cover oxide layer 7. The capacitor 10 has a lower electrode 11, an upper electrode 12 and a high-epsilon dielectric/ferroelectric 13 therebetween.

The high-epsilon dielectric/ferroelectric 13, for example PZT, SBT, ST or BST, is deposited through the use of an MOD (Metal Organic Deposition) process, an MOCVD (Metal Organic Chemical Vapor Deposition) process or a sputtering process.

After the deposition of the high-epsilon dielectric/ferroelectric 13, it must be tempered ("conditioned"), if necessary several times, in an oxygen-containing atmosphere at temperatures of about 550–800° C. In order to avoid unwanted chemical reactions of the high-epsilon dielectric/ferroelectric 13 with the electrodes 11, 12, they are made of Pt (or any other sufficiently temperature-stable and inert material).

Other deposition processes are required before and after the deposition of the high-epsilon dielectric/ferroelectric 13 in order to produce the electrodes 11, 12.

During the tempering step mentioned above, Bi, Ba or Sr, for example, can diffuse through the bottom Pt electrode 11 from the high-epsilon dielectric/ferroelectric 13. Furthermore, Pt has a high diffusibility in Si at temperatures above about 550° C. Therefore, a continuous barrier layer 14 of TiN, TaN, Ir, $IrO_2$, $MoSi_2$ or any other suitable material is provided underneath the bottom Pt electrode 11 to protect the connecting structure 9. The barrier layer 14 is also created by a deposition process (and, if necessary, a subsequent tempering step), which is carried out before the deposition of the Pt electrodes 11, 12 and of the high-epsilon dielectric/ferroelectric 13, according to the illustrated layer sequence.

All "new type" substances (metals and rare earth metals) needed for the capacitor and barrier-layer build up could also come into direct contact with the usually exposed back of the Si-semiconductor wafer in the deposition processes mentioned above. A protective layer 15 is applied to the back of the Si-semiconductor wafer in order to prevent those substances from adsorbing at the back of the Si-semiconductor substrate 1 and then diffusing into it during the subsequent tempering step or steps.

The protective layer 15 can be produced before, during or after the production of the MOS transistor 2, 3, 4, 5, 6. Naturally, it must be applied before the deposition of at least those "new type" substance or substances, the penetration of which into the back of the Si-semiconductor wafer is to be prevented in any case. Thus, the protective layer 15 is usually produced before the deposition of the barrier layer 14 or, at the latest, before the deposition of the bottom Pt electrode 11.

The protective layer 15 can be formed, for example, of a $Si_3N_4$ barrier layer with a thickness of 30 nm or more under which an oxide layer of preferably at least 10 nm thickness is optionally placed for removing tension in the transition area. A further possibility resides in providing a "condensed" and possibly doped $SiO_2$ barrier layer as the protective layer 15. Furthermore, sandwich layers formed of a doped polysilicon sublayer embedded in two oxide sublayers and multiple layers formed of alternating oxide sublayers and doped polysilicon sublayers can be used. The dopant which is used can, among other things, be phosphorus, with the dopant ion (P+) acting as a complexing agent.

It has been found in practice that, among the substances mentioned, Pt (electrode material) has a particularly high tendency to contamination. It was possible to reduce the contamination of the monocrystalline silicon noticeably with respect to Pt at a thickness of the protective layer of greater than 30 nm and to reduce it by several orders of magnitude at a layer thickness of greater than 100 nm.

However, the protective layer 15 can always keep only a limited quantity of contamination away in accordance with its layer thickness, the process parameters that are used (e.g. temperature and duration of the tempering step) and the environmental dose rate of the contaminating substance or substances. Cleaning steps and/or material removal steps can be additionally provided in order to keep down the degree of contamination in the Si-semiconductor substrate 1 even at small layer thicknesses or under disadvantageous process conditions (e.g. frequent tempering, long tempering durations, high tempering temperatures).

Pt or other metal precipitations on the protective layer 15 can be detached or at least their quantity can be reduced by cleaning with aqua regia after the deposition process.

Material can be removed by an etching step in which an outer, highly contaminated sublayer of, for example, less than 10 nm of the protective layer 15 is removed. A protective nitride layer 15 can be etched, for example, with $HF/HNO_3$.

Both processes (cleaning and material removal) can be carried out both in combination and repeatedly. If a number of tempering steps are provided, a repeated removal of material, carried out between the individual tempering steps, can also be useful for reducing the degree of contamination.

The protective layer 15 can also be removed in a progressive and graduated manner in accordance with the number of process steps of the structures to be applied to the front of the Si-semiconductor substrate 1. This partial and thus repeated removal of the protective layer 15 contributes to lower the contamination of the back of the wafer to an attainable extent. In particular, this procedure has the advantage of removing the top and in each case most-contaminated layer of the protective layer 15 relatively quickly and thus the probability of further penetration of the contamination is distinctly reduced. The protective layer 15 should be applied with sufficient thickness for progressive removal.

When using a protective layer 15 formed of a nitride barrier layer and an oxide buffer layer, and the cleaning and material removal steps mentioned, it was possible to verify after these layers had been removed through the use of TRXRF (total reflection X-ray fluorescence) that the degree of Pt contamination of the Si-semiconductor substrate 1 was less than $10^{11}$ atoms/cm$^2$ with a wafer thickness of 1 mm.

I claim:

1. A method for processing a monocrystalline Si-semiconductor wafer, which comprises:
    subjecting the Si-semiconductor wafer to a plurality of tempering steps at a temperature of over 550° C.;
    applying a protective layer to the back of the Si-semiconductor wafer with a layer deposition process, and cleaning the protective layer for removing adsorbed substances after the layer deposition process, at least once before one of the tempering steps, the protective layer protecting against penetration of at least one metal substance into the Si-semiconductor wafer during the one tempering step; and
    at least partially removing the protective layer for removing a contaminated surface area between two of the tempering steps.

2. The method according to claim 1, wherein the protective layer protects against penetration of at least one rare earth metal substance.

3. A method for processing a monocrystalline Si-semiconductor wafer, which comprises:
    subjecting the Si-semiconductor wafer to a plurality of tempering steps at a temperature of over 550° C.;
    applying a $SiO_2$ barrier layer as a protective layer to the back of the Si-semiconductor wafer, at least once before one of the tempering steps, the protective layer protecting against penetration of at least one metal substance into the Si-semiconductor wafer during the one tempering step; and
    at least partially removing the protective layer for removing a contaminated surface area between two of the tempering steps.

4. The method according to claim 3, wherein the protective layer protects against penetration of at least one rare earth metal substance.

5. The method according to claim 3, which further comprises constructing the protective layer as a three-layer barrier layer structure having a polysilicon sublayer embedded in two $SiO_2$ sublayers.

6. The method according to claim 3, which further comprises constructing the protective layer as a multilayer barrier layer structure having alternating $SiO_2$ and polysilicon sublayers.

7. A method for processing a monocrystalline Si-semiconductor wafer, which comprises:

subjecting the Si-semiconductor wafer to a plurality of tempering steps at a temperature of over 550° C.;

applying a $Si_3N_4$ barrier layer as a protective layer to the back of the Si-semiconductor wafer, at least once before one of the tempering steps, the protective layer protecting against penetration of at least one metal substance into the Si-semiconductor wafer during the one tempering step, the step of applying the protective layer including:

depositing a $SiO_2$ buffer layer; and depositing the $Si_3N_4$ barrier layer on the $SiO_2$ buffer layer; and at least partially removing the protective layer for removing a contaminated surface area between two of the tempering steps.

8. The method according to claim 7, wherein the protective layer protects against penetration of at least one rare earth metal substance.

9. The method according to claim 7, which further comprises depositing the $Si_3N_4$ barrier layer with an LPCVD processor.

10. The method according to claim 7, which further comprises providing the protective layer with a thickness of greater than 30 nm.

11. The method according to claim 7, which further comprises providing the protective layer with a thickness of greater than 100 nm.

12. The method according to claim 7, which further comprises doping the protective layer with a substance acting as a trapping center for the at least one substance to be protected against.

13. The method according to claim 7, which further comprises doping the protective layer with phosphorus acting as a trapping center for the at least one substance to be protected against.

14. The method according to claim 7, which further comprises damaging the back of the Si-semiconductor wafer in an area close to a surface, before applying the protective layer.

* * * * *